United States Patent [19]

Nulman

[11] Patent Number: 5,747,360
[45] Date of Patent: May 5, 1998

[54] METHOD OF METALIZING A SEMICONDUCTOR WAFER

[75] Inventor: Jaim Nulman, Palo Alto, Calif.

[73] Assignee: Applied Materials, Inc., Santa Clara, Calif.

[21] Appl. No.: 439,363

[22] Filed: May 11, 1995

Related U.S. Application Data

[63] Continuation-in-part of Ser. No. 122,851, Sep. 17, 1993, Pat. No. 5,443,995.

[51] Int. Cl.⁶ ........................................ H01L 21/28
[52] U.S. Cl. ........................ 437/189; 437/190; 437/192; 437/194; 437/197; 437/195
[58] Field of Search ........................... 437/189, 190, 437/192, 194, 197, 198, 195, 203; 204/192.15, 192.17

[56] References Cited

U.S. PATENT DOCUMENTS

| | | | |
|---|---|---|---|
| 4,910,169 | 3/1990 | Hoshino | 437/198 |
| 4,931,410 | 6/1990 | Tokunaga et al. | 437/194 |
| 4,978,639 | 12/1990 | Hua et al. | 437/230 |
| 4,999,160 | 3/1991 | Lowrey et al. | 420/529 |
| 5,070,391 | 12/1991 | Liou et al. | 357/71 |
| 5,081,064 | 1/1992 | Inoue et al. | 437/190 |
| 5,169,803 | 12/1992 | Miyakawa | 437/197 |
| 5,175,125 | 12/1992 | Wong | 437/194 |
| 5,188,717 | 2/1993 | Broadbent et al. | 204/192.12 |
| 5,198,388 | 3/1993 | Kawai | 437/173 |
| 5,202,008 | 4/1993 | Talieh et al. | 204/192.32 |
| 5,229,325 | 7/1993 | Park et al. | 437/187 |
| 5,238,874 | 8/1993 | Yamada | 437/1.98 |
| 5,266,521 | 11/1993 | Lee et al. | 437/197 |
| 5,356,836 | 10/1994 | Chen et al. | 437/194 |
| 5,358,616 | 10/1994 | Ward | 204/192.15 |
| 5,358,733 | 10/1994 | Lur et al. | 437/51 |
| 5,371,042 | 12/1994 | Ong | 437/192 |
| 5,407,863 | 4/1995 | Katsura et al. | 437/194 |

FOREIGN PATENT DOCUMENTS

| | | |
|---|---|---|
| 0248445 | 12/1987 | European Pat. Off. . |
| 58-170036 | 10/1983 | Japan . |
| 61-093647 | 5/1986 | Japan . |
| 2-206122 | 8/1990 | Japan . |
| 2-230756 | 9/1990 | Japan . |
| 2-297937 | 10/1990 | Japan . |
| 3-069118 | 3/1991 | Japan . |
| 3-120722 | 5/1991 | Japan . |
| 4-017338 | 1/1992 | Japan . |
| 4-324636 | 11/1992 | Japan . |
| 5-55203 | 3/1993 | Japan . |
| 5-129298 | 5/1993 | Japan . |

OTHER PUBLICATIONS

S. Wolf, "Silicon Processing for the VLSI Era, vol. 2" Lattice Press, p. 191.
Wolf, S. and Tauber, R., *Silicon Processing for the VLSI Era*, vol. 1: Process Technology, Lattice Press, pp. 359–365, and 391–392, 1986.
Wolf, S., *Silicon Processing for the VLSI Era*, vol. 2: Process Integration, Lattice Press 245–255, and 279–286, 1990.

*Primary Examiner*—John Niebling
*Assistant Examiner*—Thomas G. Bilodeau
*Attorney, Agent, or Firm*—Haverstock & Associates

[57] ABSTRACT

A method for metallizing semiconductor materials includes two processing steps. In the first step, a layer of an alloy of conductive metal, such as aluminum, and an Alloy Material such as hafnium, tantalum, magnesium, germanium, silicon, titanium, titanium nitride, tungsten and/or a composite of tungsten, is deposited on the surface in a single step from a single source. In the second step, a layer of the conductive metal is deposited over the alloy layer. Thus, using this method, metallization can be conveniently performed using two chambers. .

27 Claims, 3 Drawing Sheets

METHOD OF METALIZING A SEMICONDUCTOR WAFER

RELATED APPLICATIONS

This application is a continuation-in-part of application Ser. No. 08/122,851, filed on Sep. 17, 1993 now U.S. Pat. No. 5,443,995.

TECHNICAL FIELD OF THE INVENTION

This invention relates generally to semiconductor processes for forming integrated circuits, and more particularly to an improved process for providing conductive pathways on semiconductor integrated circuits by sequentially depositing at least two metal layers.

BACKGROUND OF THE INVENTION

Integrated circuits are usually produced from large wafers of semiconductor material such as, for example, silicon or gallium arsenide, from which a plurality of chips can be simultaneously produced. The dimensions of the individual chips are delineated by scoring or grooving the wafer in checkerboard fashion. Each chip is provided with a circuit pattern by using standard masking and photolithographic methods to form an integrated circuit. Contact-holes are also provided for connecting between different conductive layers on a circuit.

The conductive film or metallization typically serves to electrically connect together the devices of an integrated circuit, to connect one integrated circuit to another, to allow access from outside the circuit and to form electrodes for devices. The metal most commonly used for metallization is aluminum. The aluminum can be deposited on the semiconductor wafer using any one of a variety of conventional deposition techniques, such as, for example, sputtering or evaporation. Copper can be used as an alternative to aluminum for interconnections.

Conventional metallization involves several steps preparatory to actually depositing the aluminum layer. A barrier layer can be deposited first after a contact opening is formed, if desired, to prevent the aluminum from dissolving silicon from the substrate layer, a problem referred to as "spiking." Where copper is used as the interconnect layer, a barrier layer is used to prevent the copper from diffusing into the silicon substrate which will deteriorate the performance of transistor properties.

FIGS. 1A through 1F, show a common process for forming a multi-layer metal interconnect structure. A conducting layer 100 of doped silicon or other material is provided and covered with an insulating layer 102, such as $SiO_2$ or $Si_3N_4$ as shown in FIG. 1A. A contact hole 104 is formed through the insulating layer 102 using conventional photolithographic techniques to expose a portion of the conducting layer 100.

FIG. 1B shows a barrier layer 106 formed over the surface of the structure of FIG. 1A. A barrier layer 106 is provided when the potential for aluminum spiking or copper diffusion into silicon can cause a failure. Typically, the barrier layer 106 is deposited onto the bottom of the contact opening. The barrier layer 106 is typically a compound of titanium-tungsten or titanium nitride and is very thin, on the order of 50–200 Å at the bottom. The barrier layer processing step shown in FIG. 1B is optional and its use depends upon the materials being used.

The next conventional step includes forming an adhesion layer 108 of a refractory metal, typically, titanium. Other materials include tungsten germanium and silicon. The adhesion layer provides for good adhesion of a subsequently deposited aluminum layer to the surface of the semiconductor wafer, including any dielectric materials which may have been deposited. This layer is typically 20 to 500 Å thick at the bottom of opening 104.

Next, a layer of aluminum or copper 110 is formed, typically by sputter deposition at a temperature between room temperature and 200° C. as shown in FIG. 1D. The aluminum layer can be formed of an aluminum alloy such as 1% silicon and/or 0.5% copper. Unfortunately, the deposition steps required for FIGS. 1C and 1D require separate deposition chambers to avoid contamination, the necessity of changing the target and other related deleterious factors. Such methods have dedicated deposition chambers for each layer. These chambers are mounted to a central vacuum transfer chamber, so that the layers are not exposed to any ambient, other than vacuum, typically in the range of 1E-9 to 1E-7 Torr, during transfer from one chamber to the next.

As shown in FIG. 1D, the step coverage of the aluminum aluminum alloy, copper or copper alloy layer can be poor. To improve the step coverage, heat is applied in the step of FIG. 1E in excess of 300° C. and typically in the temperature range of 400° C. to 600° C. This anneal step may be performed in the deposition chamber or in a separate anneal chamber. This causes the aluminum or copper layer 110' to flow and form an alloy layer 108' of the material deposited as the adhesion layer 108 and the aluminum or copper 110 as shown in FIG. 1E. During this heating step, a limited portion of the aluminum combines with the refractory metal to form an aluminum/refractory alloy 108'.

Lastly, additional aluminum or copper is deposited in a third deposition step which combines with the reflowed aluminum or copper layer 110' to form a thicker aluminum or copper layer 110" and thereby reduce the electrical impedance of this metal layer as shown in FIG. 1F.

An alternative process sequence has been the deposition of a thin aluminum or copper layer 110, typically 500 to 4000 angstroms. At temperatures less than 300° C. as in FIG. 1D, followed by deposition of a hot aluminum or hot copper layer 111 at temperatures between 400° and 600° C., FIG. 1E, during this hot step, part of layer 110 combines with layer 108 (FIG. 1D) to form a composite alloy layer 108' (FIG. 1E). This allows for the hot aluminum or hot copper layer 112 to flow into the opening 104. The hot aluminum or hot copper deposition can be continued until a fully planarized surface is obtained, FIG. 1F.

These processes are time consuming, and require the use of at least three different deposition chambers in order to complete a single metallization. (Four deposition chambers are needed if a barrier layer is included in the process.) Accordingly, the need exists for a process which reduces the time and equipment required to produce metallization on a semiconductor wafer.

SUMMARY OF THE INVENTION

The present invention provides a method for simultaneously metallizing the surface of semiconductor material, such as a semiconductor wafer, and filling contact-holes in the surface of the semiconductor material in two steps: first, by depositing in a single step and from a single source a layer of an alloy formed from a conductive aluminum or copper metal and an Alloy Material that alloys with the aluminum or copper. This ensures adhesion to the semiconductor structure, specifically to vertical walls. In this patent document, the term "Alloy Material" includes hafnium, tantalum, magnesium, germanium, silicon, titanium, titanium nitride, tungsten and a composite of tungsten. Second, by depositing a layer of conductive aluminum metal over the layer of alloy. This process may also include first forming a barrier layer.

BRIEF DESCRIPTION OF THE DRAWINGS

A better understanding of the invention and its advantages will be apparent from the detailed description taken in conjunction with the accompanying drawings in which.

DETAILED DESCRIPTION OF THE INVENTION

The present invention overcomes the deficiencies found in the prior art. In particular, a process according to the present invention metallizes a wafer and fills contact-holes. According to the process, a first step deposits a conductive metal alloy and an Alloy Material. The conductive metal alloy and Alloy Material are deposited at the same time from a single source. In a second step, conductive metal is deposited over the first layer and completely fills the contact-holes. In the preferred embodiment, the conductive metal is aluminum. Copper can be readily substituted for the aluminum in either or both the first and second step of the process. Other conventional conductive metals can also be substituted for the aluminum.

Figure 2A:
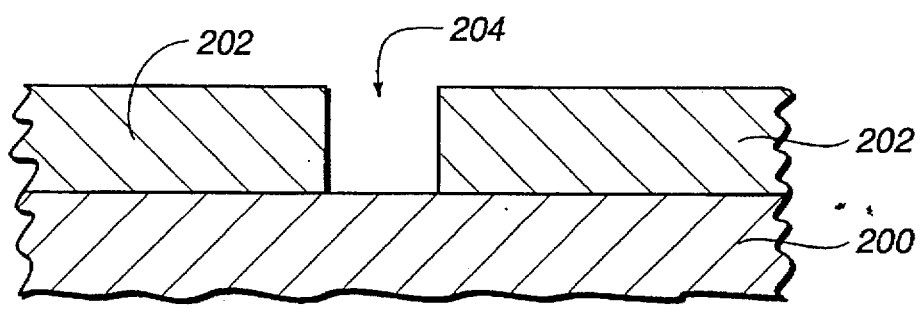
FIGS. 2A through 2F show cross-sectional views of a portion of a semiconductor wafer, taken during the several relevant steps for forming a metallization layer according to the present invention.

As shown in FIG. 2A, during the production of integrated circuits, a semiconductor wafer typically includes a conductive layer 200 which is covered with an insulating dielectric layer 202. The insulating layer 202 may be formed of multiple layers depending upon the requirements of the circuit and processing technology. The insulating layer 202 is provided with contact-holes 204 which can extend completely through the insulating layer 202 to expose a portion of the conductive layer 200.

Figure 2B:
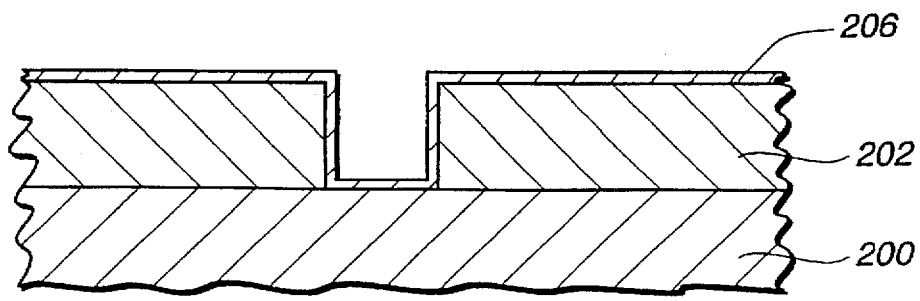

As shown in FIG. 2B, when it is desired to form a layer of conductive metal, and fill the contact-holes with the conductive metal, one can begin by depositing a conventional barrier layer 206, if such a layer is desired or needed. This barrier layer 206 can be any suitable material such as, for example, titanium-tungsten or titanium nitride. The barrier layer 206 is optional under the process of the present invention, but may be desirable where spiking or interaction with the silicon substrate might be a problem.

Figure 2C:
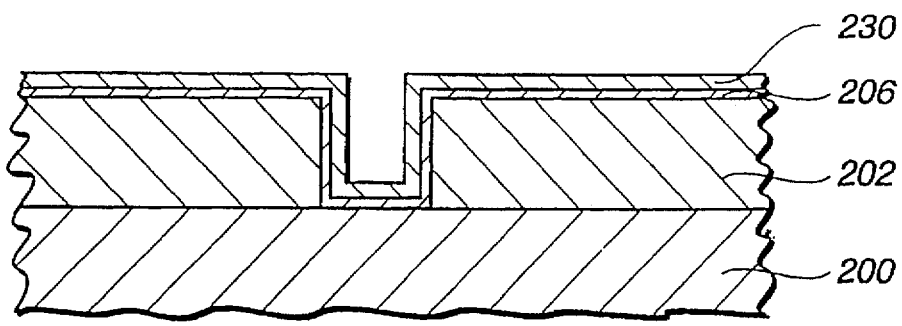

As shown in FIG. 2C, a first layer of metal alloy 230 including an adhesion metal and conductive aluminum, aluminum alloy, copper or copper alloy metal is formed of a composite of an alloy of a refractory metal or an alloy element capable of alloying and a conductive aluminum, aluminum, copper or copper alloy metal. According to the present invention, the composite alloy is formed by simultaneously depositing both the conductive aluminum, aluminum alloy, copper or copper alloy metal and the Alloy Material in the same deposition chamber. To achieve this, for example, the alloy is preferably sputter deposited using a target which is formed of both the materials to be deposited. The conductive metal can be selected from any of those known to be useful as such in semiconductor processing, and is preferably aluminum or an aluminum alloy having 1% silicon or 0.5% copper.

Figure 1A:
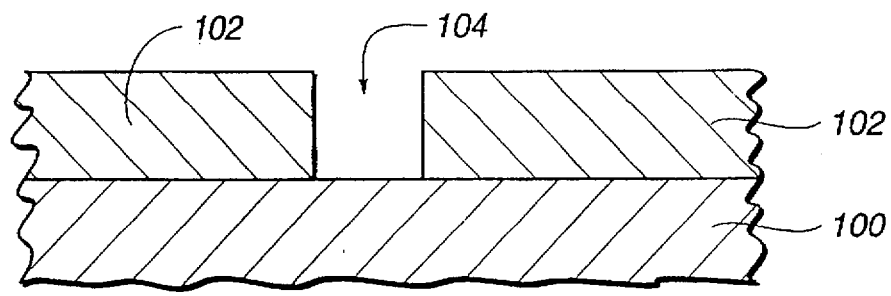
FIGS. 1A through 1F show cross-sectional views of a portion of a semiconductor wafer, taken during the several relevant steps for forming a metallization layer in the prior art.
Figure 1B:
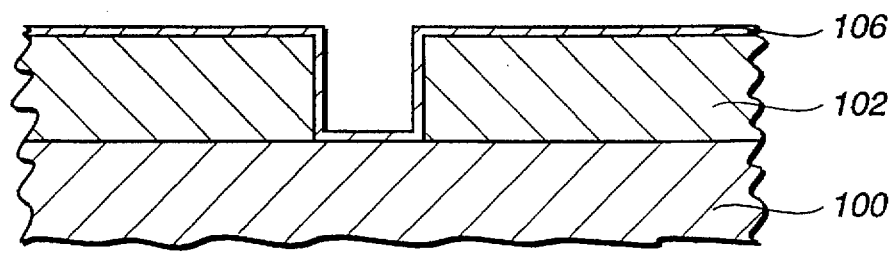
Figure 1C:
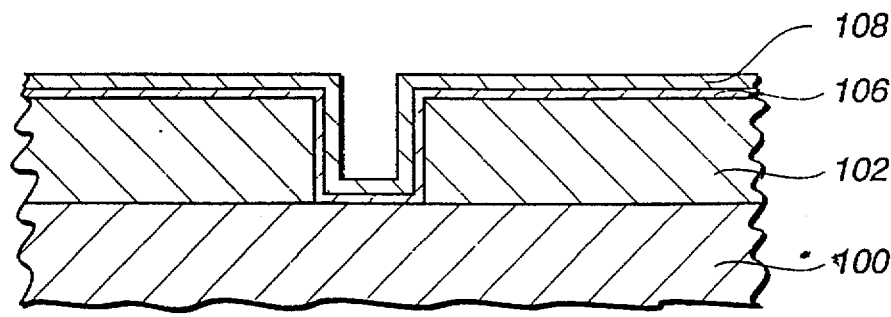
Figure 1D:
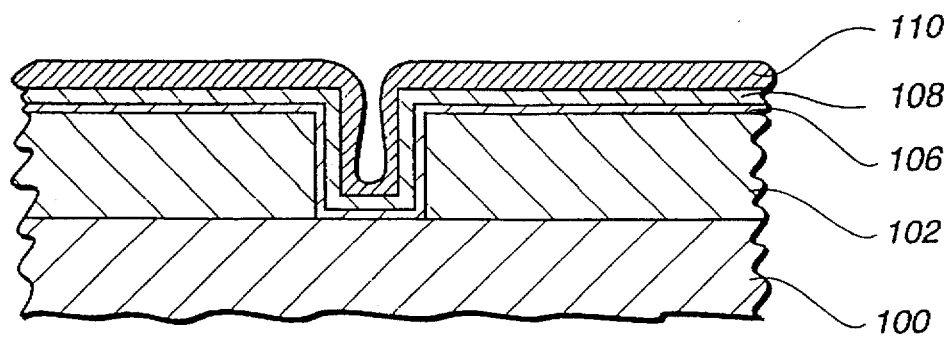
Figure 1E:
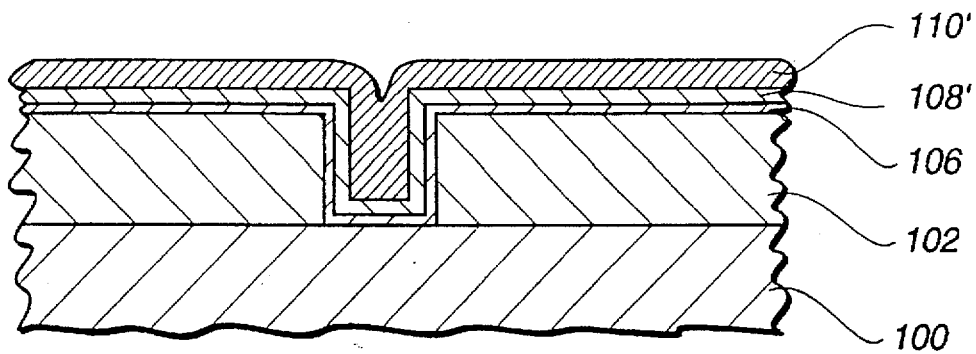
Figure 1F:
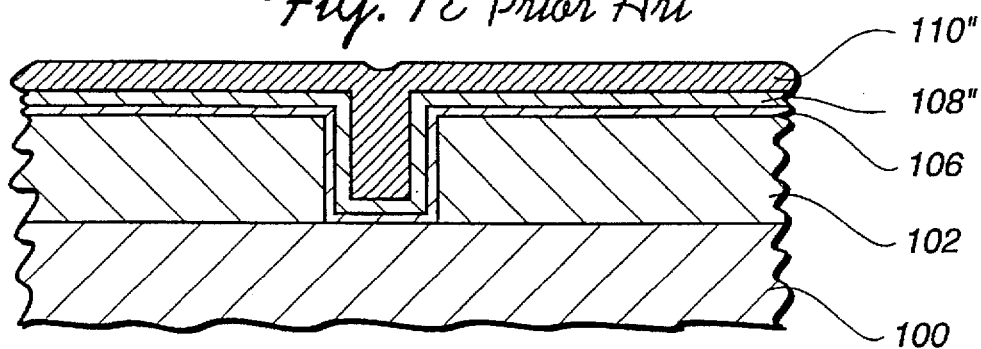

The ratio of the conductive metal to the Alloy Material in the alloy is adjusted by appropriately forming the target from the proper ratio of desired materials. The ratio can be selected to closely approximate the desired final alloy, such as that found in the layer 108' or 108" of the prior art of FIGS. 1E and 1F. However, the ratio can be any up to the solid solubility of the Alloy Material in the aluminum, aluminum alloy, copper or copper alloy.

Figure 2D:
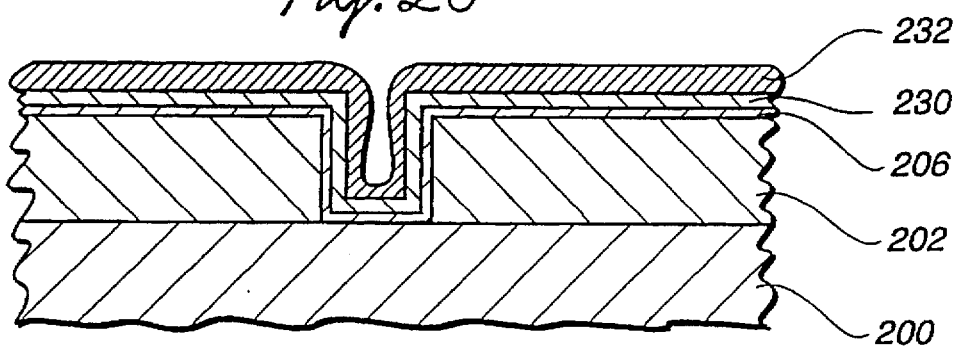

The metallization is completed, as shown in FIG. 2D, by depositing a layer of conductive aluminum, aluminum alloy, copper or copper alloy metal 232 over the alloy layer 230. The structure illustrated in FIG. 2D is obtained by placing the semiconductor wafer in a second chamber, and depositing the conductive aluminum or aluminum alloy metal, preferably by sputtering. This can be done at a low temperature in the range between room temperature to less than about 200 degrees centigrade as shown in FIG. 2D. Once the conductive aluminum, aluminum alloy, copper or copper alloy metal layer 232 is deposited at this low temperature, the wafer is next subjected to a heating step which brings the wafer to a temperature greater than 200 degrees centigrade and preferably in the range between about 400 degrees centigrade and 600 degrees centigrade, to substantially eliminate voids in the contact-holes and to provide enhanced step coverage a shown in FIG. 2E by allowing the aluminum or copper to flow into the opening 204.

Figure 2E:
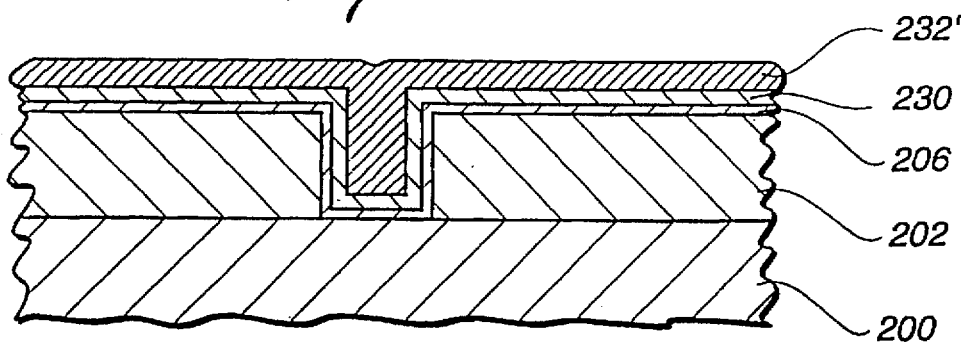
Figure 2F:
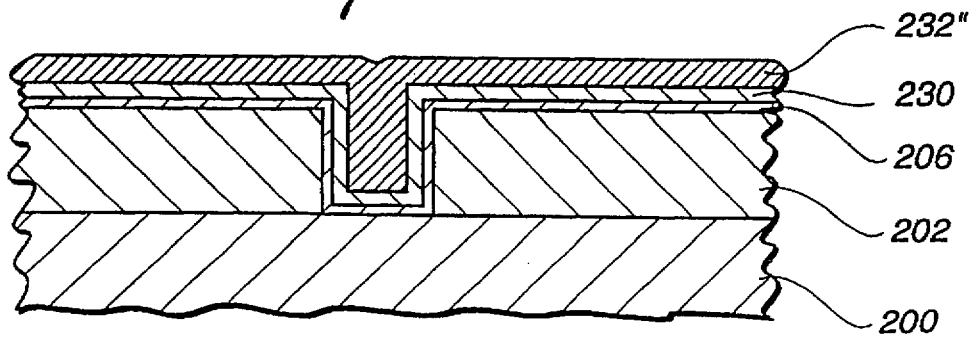

Alternatively, the steps shown in FIGS. 2D and 2E can be replaced by a "hot" deposition step as shown in FIG. 2F. During this "hot" deposition step, the conductive aluminum or aluminum alloy metal layer 232" is deposited in a chamber wherein the wafer is raised to a temperature that is greater than 200 degrees centigrade, and preferably in the range between about 400 degrees centigrade and 600 degrees centigrade before depositing the conductive metal. The conductive metal can be deposited entirely at the desired temperature, or can be deposited while ramping up the temperature.

While the preferred embodiments have been described in detail, and shown in the accompanying drawings, it will be evident that various further modification are possible without departing from the scope of the invention as set forth in the appended claims.

What is claimed is:

1. A method of simultaneously metallizing the surface of a semiconductor wafer and filling contact-holes, comprising the steps in the order listed of:

providing a semiconductor wafer;

forming an insulating layer over the semiconductor wafer;

forming a contact-hole through the insulating layer;

depositing a layer of an alloy including copper and an Alloy Material, the alloy being deposited in a single step from a single target formed of both the copper and the Alloy Material, the deposition being continued for a time period such that only a portion of the contact-hole is filled with the layer of the alloy; and depositing a layer of copper over the layer of alloy substantially filling the contact-hole thereby.

2. The method of claim 1 wherein the layer of copper is a copper alloy.

3. The method of claim 1 wherein the Alloy Material is selected from the group consisting of hafnium, tantalum, magnesium, germanium, silicon, titanium, titanium nitride, tungsten and a composite of tungsten.

4. The method of claim 1 wherein the step of depositing the alloy layer is performed in a first chamber at a temperature ranging from about room temperature to less than about 300 degrees centigrade.

5. The method of claim 1 wherein the step of depositing the layer of copper is performed in a second chamber at a temperature ranging from about room temperature to less than about 200 degrees centigrade, followed by increasing the temperature of the wafer to greater than 200 degrees centigrade.

6. The method of claim 5 wherein the temperature of the wafer is increased to a range between about 400 degrees centigrade to about 600 degrees centigrade.

7. The method of claim 1 wherein the step of depositing the layer of copper is performed at a temperature greater than about 200 degrees centigrade.

8. The method of claim 7 wherein the step of depositing the layer of copper is performed at a temperature ranging from about 400 degrees centigrade to about 600 degrees centigrade.

9. The method of claim 1 further comprising the step of forming a barrier layer between the step of forming a contact-hole and the step of depositing a layer of an alloy.

10. A method of simultaneously metallizing the surface of semiconductor material and filling contact-holes, comprising the steps in the order list of:

providing a semiconductor wafer;

forming an insulating layer over the semiconductor wafer;

forming a contact-hole through the insulating layer;

in a first chamber, depositing on the surface of the semiconductor material a layer of an alloy including copper and an Alloy Material, the alloy being deposited in a single step and from a single target formed of both the copper and the Alloy Material, the deposition being continued for time period such that only a portion of the contact-hole is filled with the layer of the alloy; and in a second chamber, depositing a layer of copper over the layer of alloy substantially filling the contact-hole thereby.

11. The method of claim 10 wherein the layer of copper is a copper alloy.

12. The method of claim 10 wherein the Alloy Material is selected from the group consisting of hafnium, tantalum, magnesium, germanium, silicon, titanium, titanium nitride, tungsten and a composite of tungsten.

13. The method of claim 10 wherein the step of depositing the alloy layer is performed at a temperature ranging from about room temperature to less than about 200 degrees centigrade.

14. The method of claim 10 wherein the step of depositing the layer of copper is performed at a temperature ranging from about room temperature to less than about 200 degrees centigrade, followed by increasing the temperature in the second chamber to greater than 200 degrees centigrade.

15. The method of claim 14 wherein the temperature in the second chamber is increased to range from about 400 degrees centigrade to about 600 degrees centigrade.

16. The method of claim 10 wherein the step of depositing the layer of copper is performed at a temperature greater than about 200 degrees centigrade.

17. The method of claim 16 wherein the step of depositing the layer of copper is performed at a temperature ranging from about 400 degrees centigrade to about 600 degrees centigrade.

18. The method of claim 10 further comprising the step of forming a barrier layer between the step of forming a contact-hole and the step of depositing on the surface of the semiconductor material a layer of an alloy.

19. A method of simultaneously metallizing the surface of a semiconductor wafer and filling contact-holes, comprising the steps in the order listed of:

providing a semiconductor wafer;

forming an insulating layer over the semiconductor wafer;

forming a contact-hole through the insulating layer;

depositing a layer of an alloy including aluminum and an Alloy Material, the alloy being deposited in a single step from a single target formed of both the aluminum and the Alloy Material, the deposition being continued for a time period such that only a portion of the contact-hole is filled with the layer of the alloy; and depositing a layer of copper over the layer of alloy substantially filling the contact-hole thereby.

20. The method of claim 19 wherein the layer of copper is a copper alloy.

21. The method of claim 19 wherein the Alloy Material is selected from the group consisting of hafnium, tantalum, magnesium, germanium, silicon, titanium, titanium nitride, tungsten and a composite of tungsten.

22. The method of claim 19 wherein the step of depositing the alloy layer is performed in a first chamber at a temperature ranging from about room temperature to less than about 300 degrees centigrade.

23. The method of claim 19 wherein the step of depositing the layer of copper is performed in a second chamber at a temperature ranging from about room temperature to less than about 200 degrees centigrade, followed by increasing the temperature of the wafer to greater than 200 degrees centigrade.

24. The method of claim 23 wherein the temperature of the wafer is increased to a range between about 400 degrees centigrade to about 600 degrees centigrade.

25. The method of claim 19 wherein the step of depositing the layer of copper is performed at a temperature greater than about 200 degrees centigrade.

26. The method of claim 25 wherein the step of depositing the layer of copper is performed at a temperature ranging from about 400 degrees centigrade to about 600 degrees centigrade.

27. The method of claim 19 further comprising the step of forming a barrier layer between the step of forming a contact-hole and the step of depositing a layer of an alloy.

* * * * *